(12) United States Patent
Ohno et al.

(10) Patent No.: US 11,519,594 B2
(45) Date of Patent: Dec. 6, 2022

(54) DISPLAY DEVICE

(71) Applicant: NIPPON SEIKI CO., LTD., Niigata (JP)

(72) Inventors: Kodai Ohno, Niigata (JP); Mitsuru Ikeno, Niigata (JP)

(73) Assignee: NIPPON SEIKI CO., LTD., Niigata (JP)

( * ) Notice: Subject to any disclaimer, the term of this patent is extended or adjusted under 35 U.S.C. 154(b) by 250 days.

(21) Appl. No.: 16/954,012

(22) PCT Filed: Dec. 18, 2018

(86) PCT No.: PCT/JP2018/046441
§ 371 (c)(1),
(2) Date: Jun. 15, 2020

(87) PCT Pub. No.: WO2019/138797
PCT Pub. Date: Jul. 18, 2019

(65) Prior Publication Data
US 2021/0088206 A1    Mar. 25, 2021

(30) Foreign Application Priority Data

Jan. 11, 2018   (JP) .............................. JP2018-002545

(51) Int. Cl.
*F21V 29/508* (2015.01)
*F21V 29/76* (2015.01)
*H05K 1/02* (2006.01)

(52) U.S. Cl.
CPC ............ *F21V 29/508* (2015.01); *F21V 29/76* (2015.01); *H05K 1/0203* (2013.01)

(58) Field of Classification Search
CPC ............ G02B 6/0085; G02F 1/133385; G02F 1/133314; G02F 1/133328; G02F 1/133608; G02F 1/133628; F21V 29/508
See application file for complete search history.

(56) References Cited

U.S. PATENT DOCUMENTS 6,045,240 A * 4/2000 Hochstein ............ H05K 1/0206
362/373
6,949,772 B2 * 9/2005 Shimizu .................. F21V 29/70
362/652

(Continued)

FOREIGN PATENT DOCUMENTS

JP            62-10496 U       1/1987
JP          2004-314860 A     11/2004

(Continued)

OTHER PUBLICATIONS

International Search Report issued in corresponding International Patent Application No. PCT/JP2018/046441, dated Feb. 26, 2019, with English translation.

*Primary Examiner* — William J Carter
(74) *Attorney, Agent, or Firm* — McDermott Will & Emery LLP (57) ABSTRACT

Provided is a display device which has improved heat dissipation efficiency. A display device according to the present invention is provided with a display unit, a circuit board which is positioned in the rear of the display unit, a heat dissipation member which is positioned in the rear of the circuit board and is capable of dissipating the heat of the circuit board, and a case body which contains at least the heat dissipation member. The heat dissipation member has a plurality of heat dissipation pieces which protrude to the outside of the case body through an opening that is provided in the case body, and which extend in the vertical direction, and the opening has an inclined surface, which is inclined upwardly, in a portion that faces the top of each heat dissipation piece.

4 Claims, 5 Drawing Sheets

(56) References Cited

U.S. PATENT DOCUMENTS

| | | | |
|---|---|---|---|
| 7,566,154 B2* | 7/2009 | Gloisten | B60Q 3/47 362/240 |
| 2006/0146531 A1* | 7/2006 | Reo | F21V 5/008 362/249.02 |
| 2008/0084701 A1* | 4/2008 | Van De Ven | F21V 17/164 362/373 |
| 2013/0258713 A1* | 10/2013 | Yu | F21V 29/74 362/97.1 |
| 2016/0161742 A1* | 6/2016 | Yonemoto | G02B 27/0101 349/11 |
| 2017/0168226 A1* | 6/2017 | Jo | G02F 1/133385 |

FOREIGN PATENT DOCUMENTS

| | | |
|---|---|---|
| JP | 2011-113904 A | 6/2011 |
| JP | 2013-088388 A | 5/2013 |
| JP | 2015-031793 A | 2/2015 |

\* cited by examiner

DISPLAY DEVICE

CROSS REFERENCE

This application is the U.S. National Phase under 35 U.S.C. § 371 of International Application No. PCT/JP2018/046441, filed on Dec. 18, 2018, which claims the benefit of Japanese Application No. 2018-002545, filed on Jan. 11, 2018, the entire contents of each are hereby incorporated by reference.

TECHNICAL FIELD

The present disclosure relates to a display device including a display element that displays predetermined information.

BACKGROUND ART

There are conventionally known display devices of this type, such as the one disclosed in Patent Document 1 below. The display device disclosed in Patent Document 1 includes a display element that displays predetermined information, a backlight unit that backlights the display element, and a case body that houses the display element and the backlight unit, and the backlight unit includes a light guide member disposed on the back side of the display element, a circuit board arranged so as to be opposed to one side surface of the light guide member, a light source (LED: Light Emitting Diode) mounted on the circuit board such that its light emitting surface is opposed to the side surface, an exterior case that houses the light guide member, the circuit board, and the light source, and a heat dissipation member that can dissipate the heat generated by the light source.

Furthermore, a plurality of hole portions are formed in areas of a bottom wall portion of the case body corresponding to part of a flat portion of the heat dissipation member so that the part of the flat portion of the heat dissipation member is opposed to the hole portions provided in the case body. This configuration allows the heat generated by the light source due to the lighting of the light source to be dissipated into the atmosphere via the circuit board, the heat dissipation member, the part of the flat portion of the heat dissipation member, and the hole portions of the case body.

PRIOR ART DOCUMENT

Patent Document

Patent Document 1: Japanese Unexamined Patent Application Publication No. 2011-113904

SUMMARY OF THE INVENTION

Problems to be Solved by the Invention

Here, the display device disclosed in the above Patent Document 1 has a configuration in which part of the flat portion of the heat dissipation member is opposed to the hole portions provided in the case body. In this configuration where the heat dissipation area of the heat dissipation member is only the part of the flat portion that is the area opposed to the hole portion provided in the case body, the contact area with the external air (atmosphere) is the part of the flat portion, which results in the disadvantage of an insufficient heat dissipation efficiency and leaves room for further improvements.

Hence, the present disclosure has an object to provide a display device that can improve the heat dissipation efficiency so as to solve the above-described disadvantage.

Solution to Problem

The present disclosure is characterized in that it includes a display unit 91, a circuit board 4 positioned behind the display unit 91, a heat dissipation member 8 positioned behind the circuit board 4 to dissipate the heat of the circuit board 4, and a case body 5 housing at least the heat dissipation member 8, the heat dissipation member 8 including a plurality of heat dissipation pieces 82 protruding to the outside of the case body 5 through an opening 54 provided in the case body 5 and extending in a vertical direction, and the opening 54 including an inclined surface 55, in a part opposed to the upper side of the heat dissipation piece 82, that is inclined upward.

Effect of the Invention

According to the present disclosure, it is possible to provide a display device that can achieve the desired purpose and improve the heat dissipation efficiency.

MODE FOR CARRYING OUT THE INVENTION

With reference to FIGS. 1 to 5, an explanation is given of, for example, a case where a display device according to the present disclosure is applied to a vehicle meter mounted in a vehicle.

Figure 1:
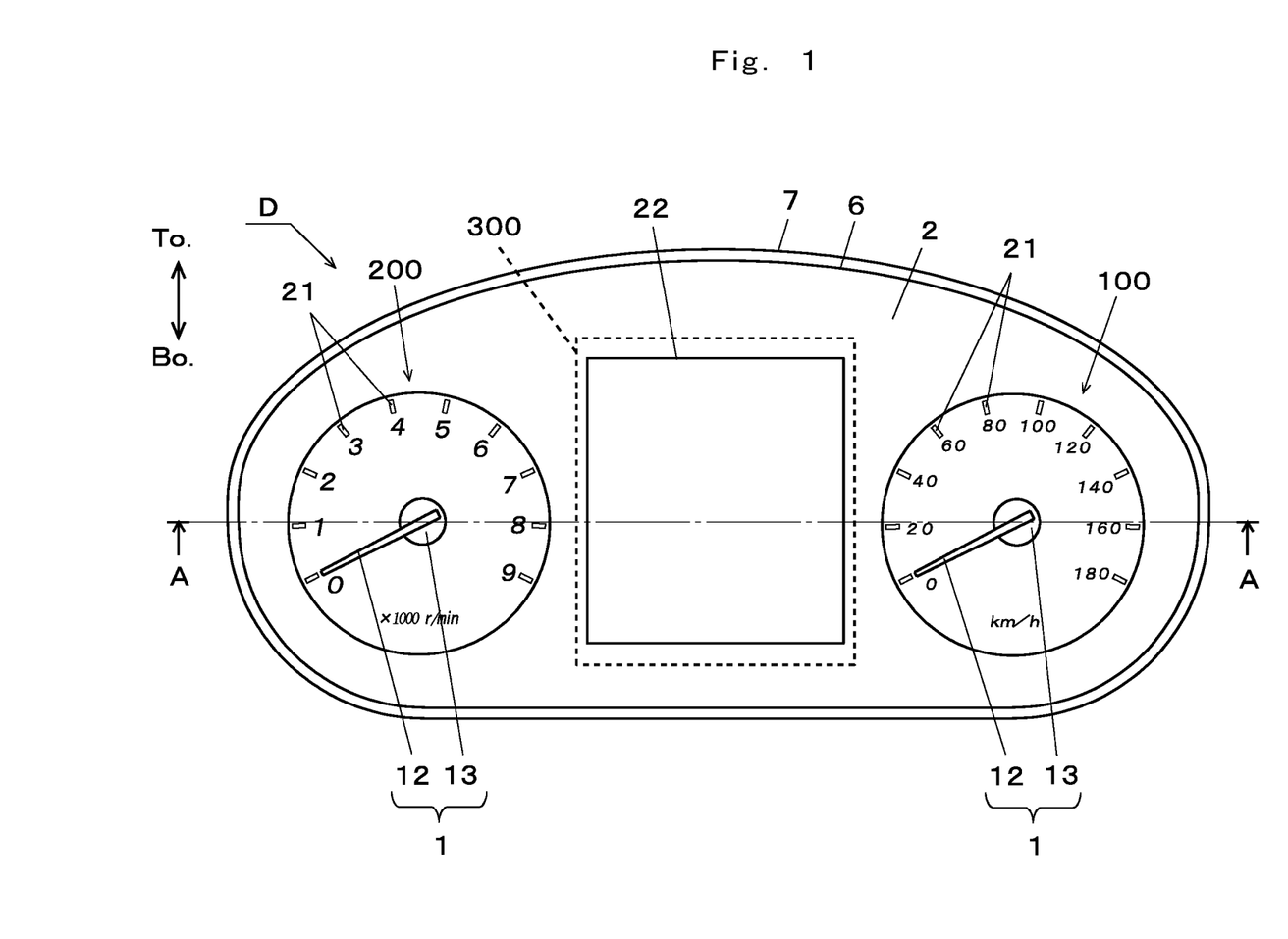
FIG. 1 is a front view of a display device illustrating an embodiment of the present disclosure.

In FIG. 1, a vehicle meter D includes an indicator-needle type display unit 100 including a speedometer that displays a vehicle speed, an indicator-needle type display unit 200 including a tachometer that displays an engine speed, and a display 300 that displays various types of vehicle information such as a traveling distance, a fuel consumption, or a time, and is configured such that the display 300 is provided between the indicator-needle type display unit 100 and the indicator-needle type display unit 200 and they are arranged side by side.

Figure 2:
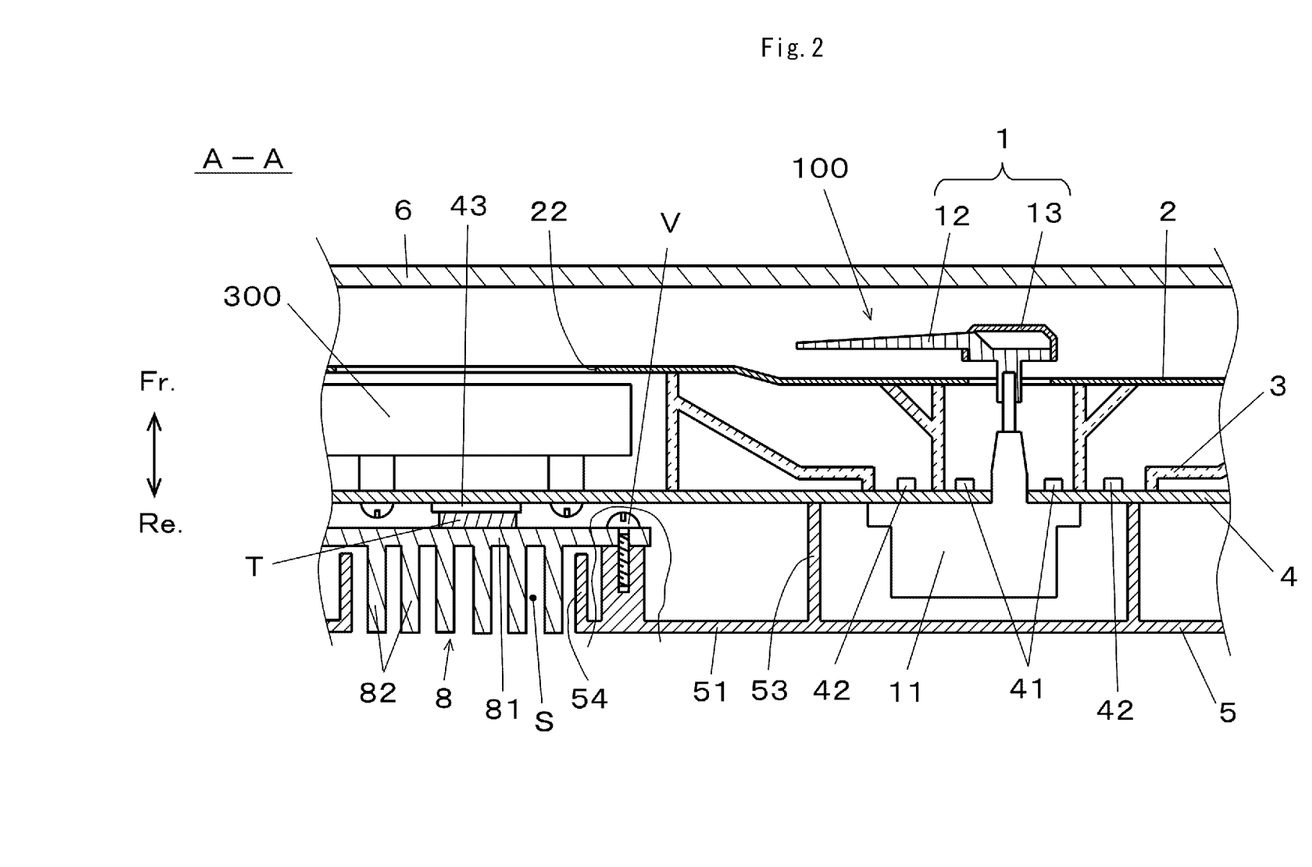
FIG. 2 is a cross-sectional view taken along the line A-A in FIG. 1.

As illustrated in FIGS. 1 and 2, the indicator-needle type display units 100 and 200 primarily include an indicator needle 1, a drive main body 11 including a meter movement to operate the indicator needle 1, the circuit board 4 that is conductively attached to the drive main body 11, a dial 2 including an index portion 21, such as a scale or a number, indicated by the indicator needle 1 and located between the indicator needle 1 and the circuit board 4, and a plurality of light-emitting elements (LEDs) 41 and 42 corresponding to the indicator needle 1 and the dial 2 are mounted on the circuit board 4 that is provided on the back side of the dial 2.

The indicator needle 1 includes an indicator portion 12 including translucent resin, and an indicator needle cap 13 including opaque resin and is coupled to the rotary shaft of the drive main body 11 so that the indicator portion 12 points the index portion 21.

The drive main body 11 includes a movable magnet drive main body, a stepping motor, or the like, and is attached to the back side of the circuit board 4 with its rotary shaft protruding toward the front side.

The index portion 21 is formed on the dial 2 such that ink is printed on the front side and the back side of a thin-plate base material such as translucent synthetic resin.

Furthermore, in this case, the indicator needle 1 is made of a translucent material that can receive and transmit the light emitted due to the lighting of the light-emitting element 41, and the index portion 21 of the dial 2 is made of a translucent material that may receive and transmit the light emitted due to the lighting of the light-emitting element 42.

Furthermore, a substantially rectangular opening window 22 for exposing a desired area of the display 300 (i.e., a display area of the display element 91, described later, included in the display 300) is formed in the area of the dial 2 corresponding to the display 300.

The circuit board 4 includes a hard wiring substrate in which a wiring pattern is applied to, for example, a glass epoxy substrate and, for example, the drive main body 11, the light-emitting elements 41 and 42, a display controller 43 that operates the display 300, a connector 44, a control means (not illustrated) that drives and controls the drive main body 11, the light-emitting element 41, the light-emitting element 42, the display 300, and the like, and circuit components such as a resistor and a capacitor are conductively connected to the wiring pattern.

The display controller 43 includes a GDC (Graphics Display Controller: a drawing control controller) and is mounted on the back surface side of the circuit board 4.

A meter housing 3 including, for example, whitish synthetic resin is provided on the front side of the circuit board 4, and a plurality of lighting rooms are formed in the meter housing 3 to house the light-emitting elements 41 and 42 and guide the light toward the indicator needle 1 and the dial 2. Furthermore, the meter housing 3 functions as a holder that holds the dial 2 and the display 300 (see FIGS. 2 and 4).

A folded member 7 is provided on the front side of the meter housing 3, an exposure surface 71 is formed in the folded member 7 to expose the visible regions (i.e., the indicator needle 1 and the index portion 21) of the indicator-needle type display units 100 and 200 and the opening window 22, and a transparent or translucent see-through panel 6 having, for example, a curved shape is provided on the front side of the folded member 7.

Furthermore, the case body 5 includes, for example, white light-shielding synthetic resin to house the dial 2, the meter housing 3, the light-emitting element 41, the light-emitting element 42, the drive main body 11, the circuit board 4, the display 300, the heat dissipation member 8, and the like.

The case body 5 is formed in substantially a boxed shape having a bottom and is configured to have an integral formation of a substantially flat-plate base 51 that is located on the back side of the circuit board 4 so as to be separated from the circuit board 4, a side wall portion 52 having an upstanding wall shape extending toward the outer peripheral edge of the meter housing 3 from the periphery of the base 51, and a plurality of projections 53 holding the circuit board 4.

Figure 4:
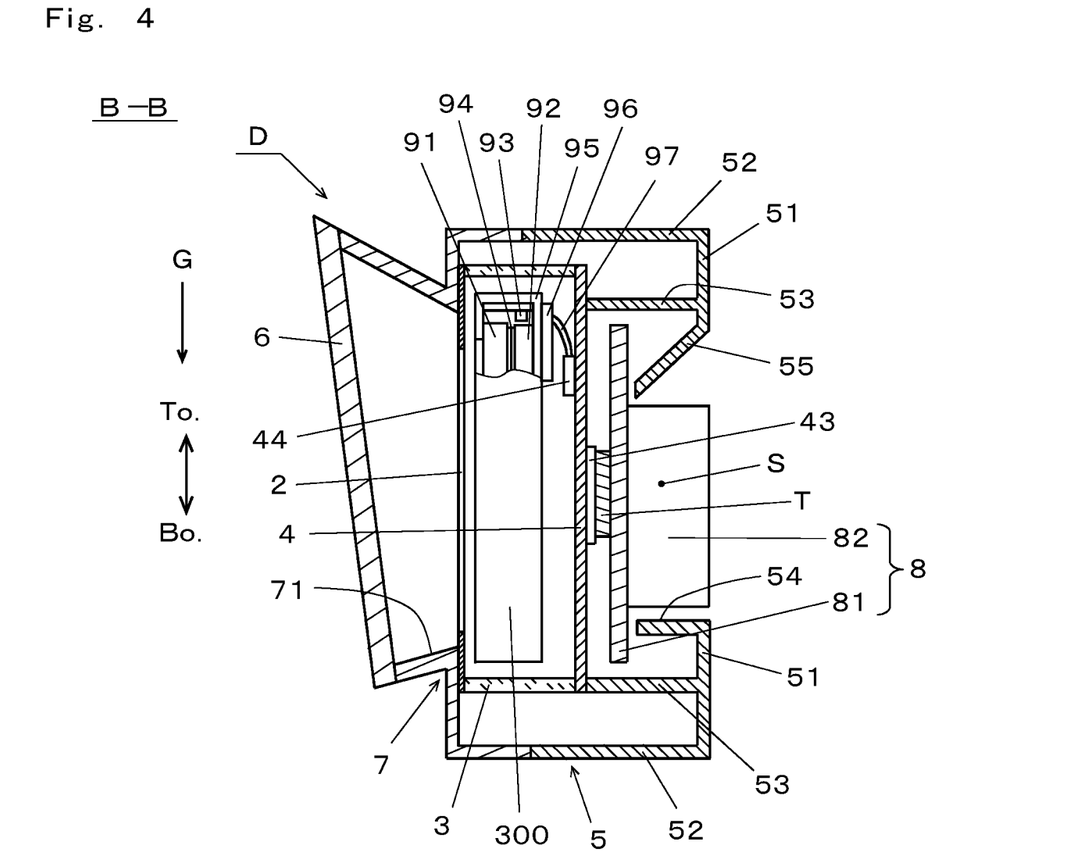
FIG. 4 is a cross-sectional view taken along the line B-B in FIG. 3.

As illustrated in FIG. 4, the display 300 includes the display element (display unit) 91, a source line drive circuit (not illustrated) that drives a source line (signal line) of the display element 91, a gate line drive circuit (not illustrated) that drives a gate line (scanning line) of the display element 91, a light guide 92, a light source 93, an optical sheet 94 including a plurality of, for example, diffusion sheets or prism sheets, and the like, and includes a frame member 95 including a conductive material to form an exterior case of the display 300 housing and holding the above, and a printed board 96 on which, for example, a timing controller (not illustrated) that generates various timing signals for controlling the timing of the source line drive circuit and the gate line drive circuit is mounted.

The display element 91 includes, for example, a TFT (Thin Film Transistor) liquid crystal display element (LCD: Liquid Crystal Display) having a plurality of pixels to display vehicle information (predetermined information), such as a traveling distance or a fuel consumption, based on detection signals from various sensors installed in the vehicle.

The light guide 92 includes substantially flat-plate translucent synthetic resin and is disposed along the back surface of the display element 91. In other words, the light guide 92 is provided in the illumination light path that leads from the light source 93 to the display element 91.

The light source 93 includes an LED that emits an appropriate color and, in FIG. 4, includes a plurality of light emitters that are disposed above the light guide 92 in rows along one side surface of the light guide 92 so as to feed illumination light to the display element 91.

The frame member 95 includes a conductive material and has substantially a frame-like shape due to press molding with a substantially rectangular opening formed at substantially the central part of the upper surface thereof so as to make the display element 91 visible.

The printed board 96 is secured to the back surface of the frame member 95 with an appropriate securing means and is coupled to the circuit board 4 via a flexible wiring board 97 and the connector 44.

Further, the heat dissipation member 8, which is a heat-sink that dissipates the heat, is disposed on the back surface side of the circuit board 4 so as to cover the display controller 43. The heat dissipation member 8 includes a metal material having a high heat conductivity, such as aluminum, and includes a main body portion 81 formed in substantially a rectangular plate shape and, on the back surface side thereof, the large number of heat dissipation fin portions 82 that can be in contact with the external air (atmosphere) outside the case body 5.

Figure 3:
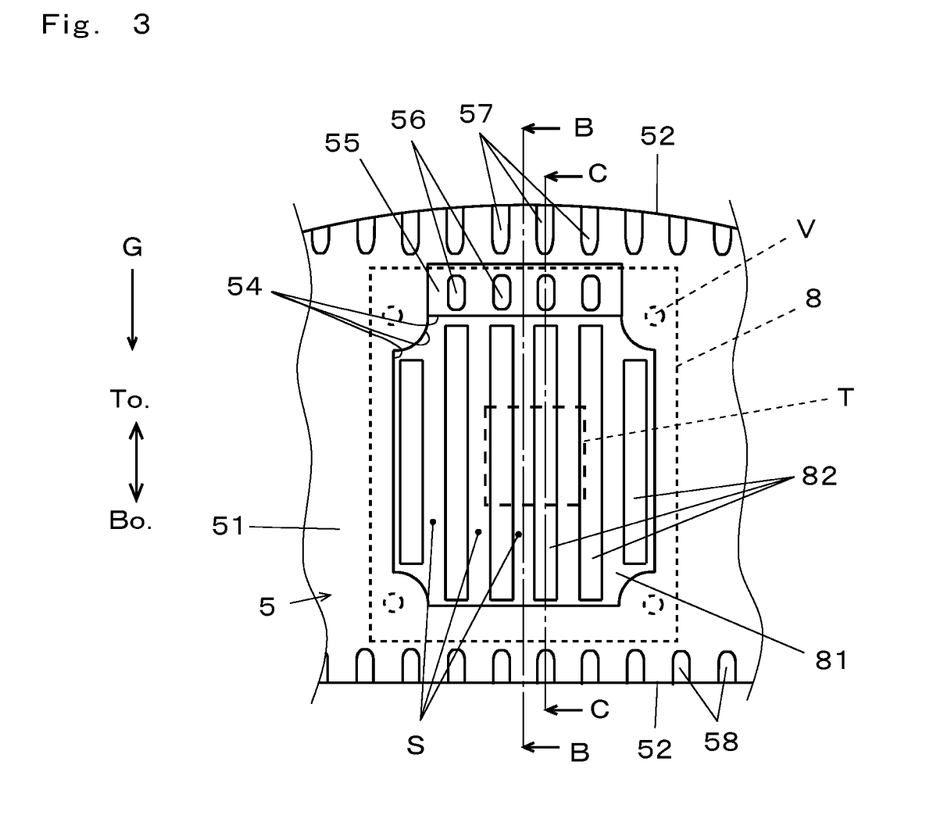
FIG. 3 is a rear view of the display device illustrating an embodiment of the present disclosure.

The heat dissipation fin portions 82 protrude to the outside through the opening 54 provided in the case body 5, extend in a vertical direction (the direction in which gravity G acts), and have a plurality of projecting pieces formed side by side in the direction (horizontal direction) perpendicular to the vertical direction. Furthermore, the heat dissipation member 8 is secured to the case body 5 with a securing means as appropriate. For example, according to the present disclosure, the main body portion 81 is secured to the base 51 of the case body 5 at the side of the circuit board 4 with screws V, or the like, on the four corners.

A thermally conductive member T is provided between the display controller 43 and the main body portion 81 so as to be in close contact with both of them. The thermally conductive member T includes an elastic member having a desired thermal conductivity and is called a TIM (Thermal Interface Material) or a thermally conductive sheet. The heat generated by the display controller 43 is transmitted to the main body portion 81 of the heat dissipation member 8 via the thermally conductive member T and is dissipated by the heat dissipation fin portions 82, whereby the temperature can be efficiently reduced.

The opening 54 of the case body 5 is formed such that the periphery of the main body portion 81 is opposed to the base 51 and is formed to have the shape of an upstanding wall extending from the base 51 toward the main body portion 81. Furthermore, the opening 54 is formed such that the inner side thereof surrounds the heat dissipation fin portions 82.

Figure 5:
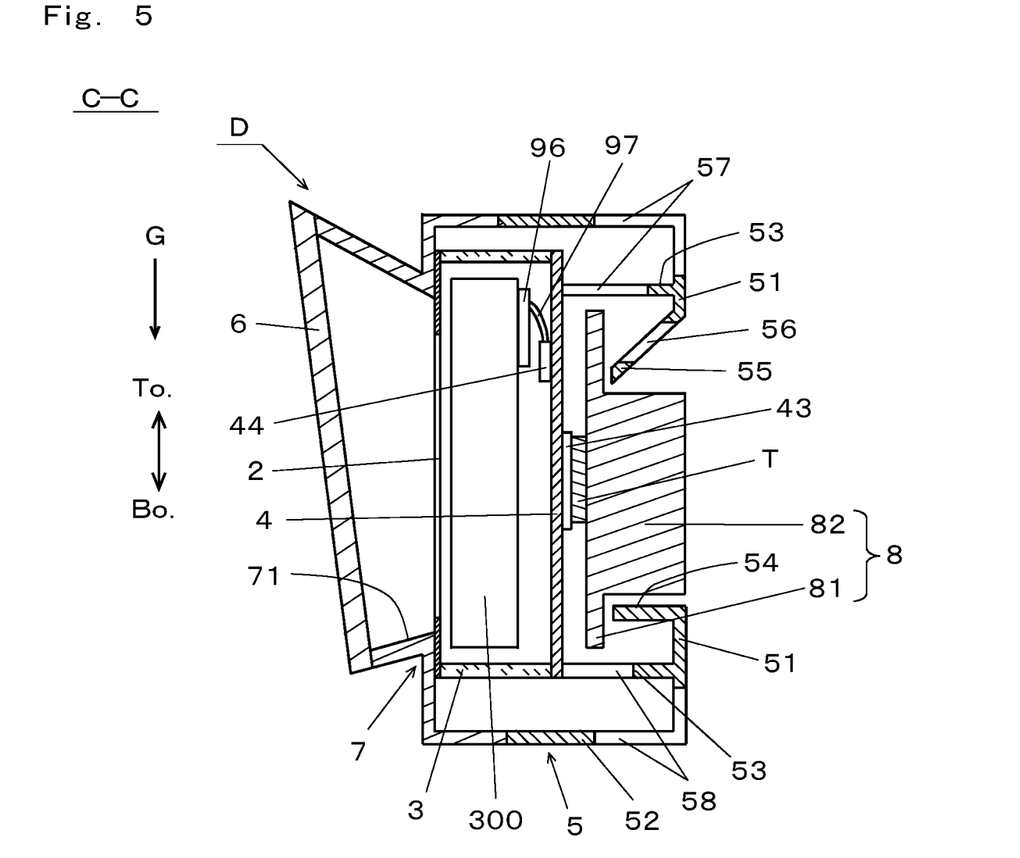
FIG. 5 is a cross-sectional view taken along the line C-C in FIG. 3.

Furthermore, the opening 54 includes the inclined surface 55, in the part opposed to the upper side of the heat dissipation fin portions 82, that is inclined upward. The inclined surface 55 is formed such that part of the outer periphery of the main body portion 81 of the heat dissipation member 8 is positioned between the inclined surface 55 and the circuit board 4. Furthermore, the inclined surface 55 includes a hole portion 56 formed at the position opposed to the heat dissipation fin portion 82. The hole portion 56 is not formed at the position that is not opposed to the heat dissipation fin portion 82.

The thus formed heat dissipation fin portions 82 increase the contact area between the external air and the heat dissipation member 8 as compared with a conventional case so as to improve the heat dissipation efficiency of the heat dissipation member 8 and make the heat generated by the display controller 43 dissipated into the atmosphere more efficiently via the heat dissipation member 8. Furthermore, as the heat generated by the display controller 43 is easily transmitted to the heat dissipation member 8, it is unlikely to be transmitted to the above-described circuit components mounted on the circuit board 4, whereby it is possible to provide the vehicle meter D that is unlikely to malfunction.

Furthermore, with the thus formed inclined surface 55, the air staying in a spatial area S between the heat dissipation fin portions 82 is heated due to the heat generated by the heat dissipation fin portions 82, moves upward (flows to a higher position), comes into contact with the inclined surface 55 located above the spatial area S, and then moves outside the vehicle meter D. Due to this air circulation, the air heated due to the heat generated by the heat dissipation fin portions 82 is prevented from staying in the opening 54, whereby it is possible to provide the vehicle meter D that can dissipate the heat of the heat dissipation member 8 efficiently, prevent an increase in the temperatures of the display controller 43 and the circuit board 4, and is unlikely to malfunction.

Furthermore, the case body 5 includes a plurality of slit portions (cut-out portions) 57 that are formed at areas (portions) of the side wall portion 52 and the projection 53 opposed to the upper side of the heat dissipation fin portions 82 so as to be opposed to the hole portion 56. The slit portions 57 are formed along the direction of the gravity G so as to communicate with the area where the heat dissipation fin portions 82 are formed.

With the thus formed slit portions 57, after the external air flows in through the hole portion 56, the external air is heated due to the heat generated by the main body portion 81, moves upward, and passes through the slit portions 57 to be dissipated to the outside of the vehicle meter D efficiently. As this air circulation prevents the external air heated by the main body portion 81 from staying in the case body 5, it is possible to provide the vehicle meter D that may dissipate the heat of the heat dissipation member 8 efficiently, prevent an increase in the temperatures of the display controller 43 and the circuit board 4, and is unlikely to malfunction.

Furthermore, as the hole portion 56 is not formed on the inclined surface 55 located above the spatial area S, the air heated in the spatial area S can come into contact with the inclined surface 55 so as to be guided to the outside without flowing into the case body 5.

Although the display device according to the present disclosure having the configuration of the above-described embodiment has been described as an example, the present disclosure is not limited thereto, and it is apparent that various improvements and modifications in design can be made in other configurations without departing from the scope of the present disclosure.

According to the present embodiment, the end portions of the heat dissipation fin portions 82 are located to be substantially even with the bottom of the base 51 of the case body 5, however, for example, the end portions of the heat dissipation fin portions 82 may protrude as compared with the bottom of the base 51.

Furthermore, although the heat dissipation member 8 is in contact with the display controller 43 via the thermally conductive member T, it may be in direct contact with the circuit board 4 or may be in direct contact with the display 300, or the like, in front of the circuit board 4 via a through-hole provided in the circuit board 4.

Furthermore, although the case body 5 includes the plurality of slit portions 57 above the heat dissipation fin portions 82, the areas (portions) of the side wall portion 52 and the projection 53 opposed to the lower side of the heat dissipation fin portions 82 may also include a plurality of slit portions 58.

DESCRIPTION OF REFERENCE NUMERALS

4 Circuit board
41 light-emitting elements
5 Case body
51 Base
52 Side wall portion
54 Opening
55 Inclined surface
56 Hole portion
57 Slit portions (cut-out portion)
8 Heat dissipation member
81 Main body portion
82 Heat dissipation fin portion (heat dissipation piece)
91 Display unit
100 Indicator-needle type display unit
300 Display
D Vehicle meter (display device)
G Gravity

The invention claimed is:
1. A display device comprising:
a display unit;
a circuit board positioned behind the display unit;
a heat dissipation member positioned behind the circuit board to dissipate heat of the circuit board; and
a case body housing at least the heat dissipation member,
wherein the heat dissipation member includes a plurality of heat dissipation pieces protruding to outside of the case body through an opening provided in the case body,
wherein the opening is tapered such that the opening includes an inclined surface,
wherein the inclined surface of the opening is arranged to be inclined upward at a part that opposes an upper side of each of the plurality of heat dissipation pieces, wherein the inclined surface of the opening includes a hole portion for each of the plurality of heat dissipation pieces, the hole portion being different from the opening, and wherein the hole portion of the inclined surface is formed only at a position that opposes each of the plurality of heat dissipation pieces.

2. The display device according to claim 1, wherein part of the heat dissipation member is positioned between the inclined surface and the circuit board.

3. The display device according to claim 1, wherein the case body includes a plurality of first slit portions, wherein the plurality of slit portions is provided at a first side wall portion of the case body at a position that opposes the hole portion, and wherein the first side wall portion of the case body is arranged at a position that opposes an upper side of the plurality of heat dissipation pieces.

4. The display device according to claim 3, wherein the case body includes a plurality of second slit portions, wherein the plurality of slit portions is provided at a second side wall portion of the case body at a position that opposes the hole portion, and wherein the second side wall portion of the case body is arranged at a position that opposes a lower side of the plurality of heat dissipation pieces.

\* \* \* \* \*